US007190614B2

(12) United States Patent
Wu

(10) Patent No.: US 7,190,614 B2
(45) Date of Patent: *Mar. 13, 2007

(54) OPERATION SCHEME FOR PROGRAMMING CHARGE TRAPPING NON-VOLATILE MEMORY

(75) Inventor: Chao-I Wu, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/133,990

(22) Filed: May 20, 2005

(65) Prior Publication Data

US 2005/0281085 A1  Dec. 22, 2005

Related U.S. Application Data

(60) Provisional application No. 60/580,518, filed on Jun. 17, 2004.

(51) Int. Cl.
    *G11C 11/34* (2006.01)
(52) U.S. Cl. .................. 365/185.03; 365/185.2
(58) Field of Classification Search .......... 365/185.03, 365/185.2
    See application file for complete search history.

(56) References Cited

U.S. PATENT DOCUMENTS

| 4,959,812 | A | 9/1990 | Momodomi et al. |
| 5,270,969 | A | 12/1993 | Iwahashi |
| 5,278,439 | A | 1/1994 | Ma et al. |
| 5,355,464 | A | 10/1994 | Fandrich et al. |
| 5,408,115 | A | 4/1995 | Chang |
| 5,424,569 | A | 6/1995 | Prall |

(Continued)

FOREIGN PATENT DOCUMENTS

JP  09162313  6/1997

(Continued)

OTHER PUBLICATIONS

Bude, J.D., et al. "Secondary Electron Flash—a High Performance, Low Power Flash Technology for 0.35 μm.and Below," Electron Devices Meeting, 1997. Technical Digest, International, Dec. 7-10, 1997, 279-282.

(Continued)

*Primary Examiner*—Michael Tran
(74) *Attorney, Agent, or Firm*—Mark A. Haynes; Haynes Beffel & Wolfeld LLP

(57) ABSTRACT

A circuit and method for self-converging programming of a charge storage memory cell, such as NROM or floating gate flash. The method includes determining a data value from one of more than two data values to be stored in the memory cell, and applying a gate voltage to the control gate at one of a predetermined set of gate voltage levels selected in response to the determined data value. Programming parameters are controlled to establish a self-converging threshold state that is determined by the selected gate voltage. In this manner, the threshold voltage converges on a target threshold corresponding with the determined data value for the memory cell. Program verify operations are reduced or eliminated in various embodiments, reducing the overall time required for the program operation, and improving device performance. A second portion of the program operation can include verify operations to improve threshold margins across the array.

16 Claims, 6 Drawing Sheets

U.S. PATENT DOCUMENTS

| | | | |
|---|---|---|---|
| 5,428,568 | A | 6/1995 | Kobayashi et al. |
| 5,448,517 | A | 9/1995 | Iwahashi |
| 5,483,486 | A | 1/1996 | Javanifard et al. |
| 5,485,422 | A | 1/1996 | Bauer et al. |
| 5,509,134 | A | 4/1996 | Fandrich et al. |
| 5,515,324 | A | 5/1996 | Tanaka |
| 5,566,120 | A | 10/1996 | D'Souza |
| 5,602,775 | A | 2/1997 | Vo |
| 5,602,789 | A | 2/1997 | Endoh et al. |
| 5,644,533 | A | 7/1997 | Lancaster et al. |
| 5,694,356 | A | 12/1997 | Wong et al. |
| 5,745,410 | A | 4/1998 | Yiu et al. |
| 5,768,192 | A | 6/1998 | Eitan |
| RE35,838 | E | 7/1998 | Momodomi et al. |
| 5,895,949 | A | 4/1999 | Endoh et al. |
| 5,966,603 | A | 10/1999 | Eitan |
| 6,011,725 | A | 1/2000 | Eitan |
| 6,023,423 | A | 2/2000 | Aritome |
| 6,034,896 | A | 3/2000 | Ranaweera et al. |
| 6,067,251 | A | 5/2000 | Hirano |
| 6,074,917 | A | 6/2000 | Chang et al. |
| 6,075,727 | A | 6/2000 | Morton et al. |
| 6,096,603 | A | 8/2000 | Chang et al. |
| 6,172,907 | B1 | 1/2001 | Jenne |
| 6,194,272 | B1 | 2/2001 | Sung |
| 6,215,148 | B1 | 4/2001 | Eitan |
| 6,219,276 | B1 | 4/2001 | Parker |
| 6,297,096 | B1 | 10/2001 | Boaz |
| 6,320,786 | B1 | 11/2001 | Chang et al. |
| 6,363,013 | B1 | 3/2002 | Lu et al. |
| 6,396,741 | B1 | 5/2002 | Bloom et al. |
| 6,436,768 | B1 | 8/2002 | Yang et al. |
| 6,445,617 | B1 | 9/2002 | Sakakibara |
| 6,458,642 | B1 | 10/2002 | Yeh et al. |
| 6,487,114 | B2 | 11/2002 | Jong et al. |
| 6,496,417 | B1 | 12/2002 | Shiau et al. |
| 6,512,696 | B1 | 1/2003 | Fan et al. |
| 6,538,923 | B1 | 3/2003 | Parker |
| 6,552,386 | B1 | 4/2003 | Wu |
| 6,556,481 | B1 | 4/2003 | Hsu et al. |
| 6,566,699 | B2 | 5/2003 | Eitan |
| 6,587,903 | B2 | 7/2003 | Roohparvar |
| 6,614,070 | B1 | 9/2003 | Hirose et al. |
| 6,614,694 | B1 | 9/2003 | Yeh et al. |
| 6,643,181 | B2 | 11/2003 | Sofer et al. |
| 6,643,185 | B1 | 11/2003 | Wang et al. |
| 6,646,924 | B1 | 11/2003 | Tsai et al. |
| 6,657,894 | B2 | 12/2003 | Yeh et al. |
| 6,670,240 | B2 | 12/2003 | Ogura et al. |
| 6,670,671 | B2 | 12/2003 | Sasago et al. |
| 6,683,811 | B2 | 1/2004 | Ishii et al. |
| 6,690,601 | B2 | 2/2004 | Yeh et al. |
| 6,714,457 | B1 | 3/2004 | Hsu et al. |
| 6,721,204 | B1 | 4/2004 | Yeh et al. |
| 6,829,175 | B2 | 12/2004 | Tsai et al. |
| 6,834,012 | B1 | 12/2004 | He et al. |
| 6,836,435 | B2 | 12/2004 | Li |
| 6,912,163 | B2 | 6/2005 | Zheng et al. |
| 6,937,511 | B2* | 8/2005 | Hsu et al. ............... 365/185.03 |
| 2002/0167844 | A1 | 11/2002 | Han et al. |
| 2002/0179958 | A1 | 12/2002 | Kim |
| 2003/0036250 | A1 | 2/2003 | Lin et al. |
| 2003/0185055 | A1 | 10/2003 | Yeh et al. |
| 2004/0084714 | A1 | 5/2004 | Ishii et al. |
| 2004/0145024 | A1 | 7/2004 | Chen et al. |
| 2005/0001258 | A1 | 1/2005 | Forbes |
| 2005/0237801 | A1* | 10/2005 | Shih ...................... 365/185.11 |
| 2005/0237809 | A1* | 10/2005 | Shih et al. ............. 365/185.18 |
| 2005/0237813 | A1* | 10/2005 | Zous et al. ............ 365/185.24 |
| 2005/0237815 | A1* | 10/2005 | Lue et al. .............. 365/185.28 |
| 2005/0237816 | A1* | 10/2005 | Lue et al. .............. 365/185.28 |
| 2005/0281085 | A1* | 12/2005 | Wu ........................ 365/185.19 |
| 2006/0039219 | A1* | 2/2006 | Sofer et al. ................. 365/222 |
| 2006/0044934 | A1* | 3/2006 | Wong et al. ................ 365/239 |
| 2006/0050562 | A1* | 3/2006 | Cernea et al. ......... 365/185.21 |

FOREIGN PATENT DOCUMENTS

| | | |
|---|---|---|
| JP | 11233653 | 8/1999 |
| WO | WO 94/28551 | 12/1994 |

OTHER PUBLICATIONS

Chang, Kuo-Tung, et al., "A New SONOS Memory Using Source-Side Injection for Programming," IEEE Electron Device Letters, vol. 19, No. 7, Jul. 1998, 253-255.

Chung, Steve S., et al., "A Novel Leakage Current Separation Technique in a Direct Tunneling Regime Gate Oxide SONOS Memory Cell," Electron Devices Meeting, 2003. IEDM '03 Technical Digest. IEEE International. Dec. 8-10, 2003 pp. 26.6.1-26.6.4.

Chung, Steve S., "Low Voltage/Power and High Speed Flash Memory Technology for High Performance and Reliability," The 3rd WIMNACT—Singapore, Oct. 15, 2003, 1-48.

De Blauwe, Jan, "Nanocrystal Nonvolatile Memory Devices," IEEE Transactions on Nanotechnology, vol. 1, No. 1, Mar. 2002, 72-77.

Eitan, Boaz, "Can NROM, a 2-bit, Trapping Storage NVM Cell, Give a Real Challenge to Floating Gate Cells?" SSDM, Tokyo, Japan (1999), 3 pages.

Eitan, Boaz, et al. "NROM: A Novel Localized Trapping, 2-Bit Nonvolatile Memory Cell," IEEE Electron Device Letters, vol. 21, No. 11, Nov. 2000, 543-545.

Fujiwara, I., et al., "0.13 μm MONOS single transistor memory cell with separated source lines," IEDM 1998, 995-998.

Hirose, M., "Challenges for Future Semiconductor Development," Microprocesses and Nanotechnology Conference, 2002. Digest of Papers. Microprocesses and Nanotechnology 2002. 2002 International, Nov. 6-8, 2002, pp. 2-3, plus 24 pages from outline.

Huff, H.R. and Bevan, M., assemblers, "Questions at the International Workshop on Gate Insulators," Ad Hoc Meeting on High-k Gate Dielectrics at the Semiconductor Interface Specialists Conference, Nov. 30, 2001, 3 pages.

Janai, Meir, ∂Data Retention Endurance and Acceleration Factors NROM Devices, IEEE 41st Annual International Reliabilty Physics Symposium, Dallas, Texas, 2003, 502-505.

Kobayashi, T., et al., A Giga-Scale Assist-Gate (AG)-AND-Type Flash Memory Cell with 20-MB/s Programming Throughput for Content-Downloading Applications, IEDM 2001, 2.2.1-2.2.4.

Lee, Chang Hyun, et al. "A Novel SONOS Structure of SiO2/SiN/Al2O3 with TaN Metal Gate for Multi-Giga Bit Flash Memories," Electron Devices Meeting, 2003. IEDM '03 Technical Digest. IEEE International, Dec. 8-10, 2003, 26.5.1-26.5.4.

Lee, Changhyun, et al., "A Novel Structure of SiO2/SiN/High k Dielectrics, Al2O3 for SONOS Type Flash Memory," Extended Abstracts of the 2002 International Conference on Solid State Devices and Materials, Sep. 17-19, 2002, Nagoya, 162-163.

Lee, Jae-Duk, et al., "Effects of Floating-Gate Interference on NAND Flash Memory Cell Operation," IEEE Electron Device Letters, vol. 23, No. 5, May 2002, 264-266.

Liu, Zhizheng, et al., "A New Programming Technique for Flash Memory Devices," International Symposium on VLSI Technology, Systems and Applications, Jun. 8-10, 1999, 195-198.

Lusky, Eli et al., "Electron Discharge Model of Locally-Trapped Charge in Oxide-Nitride-Oxide (ONO) Gates for NROM Non-Volatile Semiconductor Memory Devices," SSDM, Tokyo, Japan (Sep. 2001), 2 pages.

Lusky, Eli et al., "Spatial characterization of Channel hot electron injection Utilizing subthreshold slope of the localized charge storage NROM memory device," Non-Volatile Semiconductor Memory Workshop, Monterey, CA (Aug. 2001) 2 pages.

Naruke, K., et al. "A new Flash-Erase EEPROM Cell with a Sidewall Select-Gate on its Source Side," Nonvolatile Semiconductor Memories: Technologies, design and application, C. Hu. Ed., New York, IEEE Press, 1991, Ch. 5, pp. 183-186.

Sasago, Y, et al., "90-nm-node multi-level AG-AND type flash memory with cell size of true 2 F2/bit and programming throughput of 10 MB/s," IEEE, 2003, 4 pages.

Shin, Yoocheol, et al., "High Reliable SONOS-type NAND Flash Memory Cell with Al2O3 for Top Oxide," Non-Volatile Semiconductor Memory Workshop, 2003, 2 pages.

Tsai, W.J., et al., "Data Retention Behavior of a SONOS Type Two-Bit Storage Flash Memory Cell," Electron Devices Meeting, 2001. IEDM Technical Digest International, Dec. 2-5, 2001 pp. 32.6.1-32.6.4.

U.S. Appl. No. 11/118,839, filed Apr. 29, 2005, "Inversion Bit Line, Charge Trapping Non-Volatile Memory and Method of Operating Same," 34 pages.

U.S. Appl. No. 11/085,444, filed Mar. 21, 2005, entitled "Method for Manufacturing a Multiple-Gate Charge Trapping Non-Volatile Memory," 71 pages.

U.S. Appl. No. 10/855,286, filed May 26, 2004, entitled "Nand-Type Non-Volatile Memory Cell and Method for Operating Same," 15 pages.

U.S. Appl. No. 11/085,458, filed Mar. 21, 2005, entitled "Charge Trapping Non-Volatile Memory and Method for Gate-by-Gate Erase for Same," 73 pages.

U.S. Appl. No. 11/085,325, filed Mar. 21, 2005, entitled "Memory Array Including Multiple-Gate Charge Trapping Non-Volatile Cells," 74 pages.

U.S. Appl. No. 11/085,326, filed Mar. 21, 2005, entitled "Charge Trapping Non-Volatile Memory with Two Trapping Locations per Gate, and Method for Operating Same," 73 pages.

U.S. Appl. No. 11/085,300, filed Mar. 21, 2005, entitled "Charge Trapping Non-Volatile Memory and Method for Operating Same," 73 pages.

Wang, Tahui, et al., "Reliability Models of Data Retention and Read-Disturb in 2-bit Nitride Storage Flash Memory Cells," Electron Devices Meeting, 2003. IEDM '03 Technical Digest. IEEE International, Dec. 8-10, 2003, pp. 7.4.1-7.4.4.

White, Marvin, H., et al., "On the Go with SONOS," Circuits and Devices Magazine, IEEE, vol. 16, Issue: 4, Jul. 2000, pp. 22-31.

Yeh, C.C., et al., "Novel Operation Schemes to Improve Device Reliability in a Localized Trapping Storage SONOS-type Flash Memory," Electron Devices Meeting, 2003. IEDM '03 Technical Digest. IEEE International, Dec. 8-10, 2003, pp. 7.5.1-7.5.4.

Yeh, C.C., et al., "PHINES: A Novel Low Power Program/Erase, Small Pitch, 2-Bit per Cell Flash Memory," Electron Devices Meeting, 2002. IEDM '02. Digest. International, Dec. 8-11, 2002, pp. 931-934.

Lahiri, S. K., "MNOS/Floating-Gate Charge Coupled Devices for High Density EEPROMS: A New Concept", Physics of Semiconductor Devices,Dec. 1997, pp. 951-956, vol. 3316, No. 2.

* cited by examiner

OPERATION SCHEME FOR PROGRAMMING CHARGE TRAPPING NON-VOLATILE MEMORY

RELATED APPLICATIONS

The present application claims the benefit of U.S. Provisional Application No. 60/580,518, filed 17 Jun. 2004.

BACKGROUND OF THE INVENTION

1. Field of the Invention

The present invention relates to electrically programmable and erasable non-volatile memory, and more particularly to a programming operation for charge trapping memory.

2. Description of Related Art

Electrically programmable and erasable non-volatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names NROM, SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

One basic technique used in many prior art devices to inject charge into the charge storage element is known as hot electron injection. Hot electron injection involves applying a high-voltage to a control gate on the memory cell, a high-voltage to the drain, and ground or a low-voltage to the source. This biasing arrangement causes current to flow in the channel, and hot electrons are injected from the channel into the charge storage element because of the electric field established by the high control gate voltage. A SONOS-type cell that is programmed using hot electron injection is referred to as an NROM cell herein.

There are many variations on biasing schemes used for hot electron injection. One basic problem being addressed by these variations arises because the memory cells in a large array do not all behave uniformly during a programming operation. Therefore, for a given program pulse, there is a wide distribution in the amount of charge injected into the charge storage elements of memory cells in the array on a single device. The wide distribution of charge after a program pulse makes it difficult to predict the threshold voltage of the memory cell. Accordingly, algorithms have risen which attempt to account for the distribution in charge, and typically involve applying a program pulse and then executing a verify operation to test the threshold of the memory cell after the pulse. If the threshold has not reached the target threshold after the first pulse, then the programming is retried, followed by another verify operation, and so on. A discussion of this issue is provided in Bloom et al., U.S. Pat. No. 6,396,741, entitled PROGRAMMING OF NONVOLATILE MEMORY CELLS, issued May 28, 2002. See also, Chang et al., U.S. Pat. No. 6,320,786, entitled METHOD OF CONTROLLING MULTI-STATE NROM, issued Nov. 20, 2001; and Parker, U.S. Pat. No. 6,219,276, entitled MULTILEVEL CELL PROGRAMMING, issued Apr. 17, 2001.

Some conventional program methods are based on algorithms which apply constant drain voltage, on algorithms which step the drain voltage during the program operation, and on algorithms which step the gate voltage during the program operation. These algorithms as applied to NROM however do not lead to convergence of the threshold voltage after many pulses, and require a verify operation to determine the end of the operation. The verify operation is time-consuming, and requires complex program algorithms and supporting circuitry. In floating gate flash memory, while some program algorithms may self-converge, the programming speed and accuracy can be improved.

It is desirable therefore to provide a programming algorithm for charge storage memory cells which is self-converging, eliminating or reducing the need for verify operations, and reducing the time required for the program operation. Furthermore, it is desirable to provide a programming algorithm which is self-converging at more than one target threshold level to allow multiple bit storage in a single memory cell.

SUMMARY OF THE INVENTION

The present invention provides a method for self-converging programming of a multiple-bit per cell, charge storage memory cell having a source and a drain in a substrate, a charge storage element and a control gate. In one embodiment, the method includes determining a data value from one of more than two data values to be stored in the memory cell, and applying a gate voltage to the control gate at one of a predetermined set of gate voltage levels selected in response to the determined data value. Programming parameters are controlled to establish a self-converging threshold state that is determined by the selected gate voltage. In this manner, the threshold voltage converges on a target threshold corresponding with the determined data value for the memory cell. Program verify operations are reduced or eliminated in various embodiments, reducing the overall time required for the program operation, and improving device performance.

Embodiments of the method include:
  determining a data value from one of more than two data values to be stored in the memory cell;
  applying a gate voltage to the control gate relative to a reference voltage, a source voltage to the first terminal relative to the reference voltage, and a drain voltage to the second terminal relative to the reference voltage, in a program operation to induce charge transfer by hot electron injection to the charge storage element to establish a threshold voltage for the memory cell; and
  holding the gate voltage substantially constant at one of a predetermined set of gate voltages in response to the determined data value during a portion of the program operation in which the voltage threshold converges on a target threshold corresponding with the determined data value.

In yet other embodiments of the invention, the procedure for cells storing only two or storing more than two data values, includes applying a sequence of drain voltage pulses having pulse heights to the second terminal of the memory cell during the program operation, the sequence of drain voltage pulses including a first set of pulses applied during said portion of the program operation, without verify operations between the pulses, and a second set of pulses applied during a second portion of the program operation, and including applying verify pulses between at least two successive pulses in the second set of pulses.

In charge trapping memory cell technologies, like SONOS-type cells, multilevel data can be stored in each side of the cell, in embodiments of the present invention.

The present invention is also embodied by an integrated circuit memory that comprises a memory array including decoding circuitry to select memory cells for programming. The integrated circuit includes a voltage supply circuit coupled to the memory array and adapted to apply a gate voltage, a source voltage and a drain voltage to the control gate, source and drain respectively of memory cells in the array. A program controller is coupled to the decoding circuit and to the voltage supply circuit. The program controller is adapted to execute program operations as described above.

The invention is applicable to charge storage memory cells programmed by hot electron injection, including NROM cells in which charge is trapped in a charge trapping layer formed of silicon nitride, or other material, and floating gate flash memory cells in which charge is trapped in a conductive floating gate formed of polysilicon.

Implementations of the present invention require fewer program pulses and shorter programming times than prior art approaches. Also, over-programming is avoided because of the self-convergence of the threshold. The level of the self-converged threshold voltage can be well-controlled according to implementations of the present invention, allowing for realizations of multiple memory states in charge storage memory cells. According to embodiments of the invention, the target threshold can be selected by setting the gate voltage to a level corresponding with the data values to be stored, while reducing the times required for verify operations.

Other aspects and advantages of the present invention can be seen on review of the drawings, the detailed description and the claims, which follow.

DETAILED DESCRIPTION

A detailed description of embodiments of the present invention is provided with reference to FIGS. 1–10.

Figure 1:
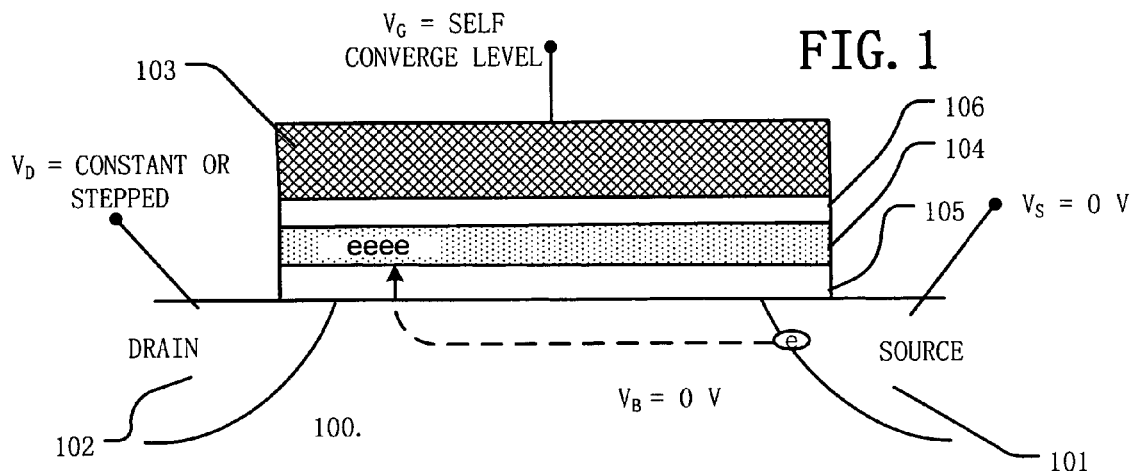
FIG. 1 is a simplified diagram of an NROM memory cell with program pulse voltages according to an embodiment of the present invention.

FIG. 1 is a simplified diagram of an NROM memory cell suitable for use in embodiments of the present invention. The memory cell is implemented in a semiconductor substrate 100. The cell includes a source 101 and a drain 102 formed by respective diffusion regions, separated by a channel in the substrate 100. A control gate 103 overlies the channel. A charge storage element, such as charge trapping layer 104, is isolated by an insulator 106 such as silicon dioxide or silicon oxynitride between the charge trapping layer 104 and the control gate 103 and an insulator, such as gate dielectric 105 comprising silicon dioxide or silicon oxynitride between the charge trapping layer 104 and the channel. The charge trapping layer 104 comprises silicon nitride or silicon oxynitride in typical NROM cells. In other embodiments, other charge trapping material, such as $Al_2O_3$, $HfO_x$, $ZrO_x$, or other metal oxide can be used to form memory cells. Charge symbolized by electrons "e" is trapped in the nitride layer, when the cell is biased for hot electron programming.

In order to program the memory cell by hot electron injection, control circuitry on the integrated circuit applies a source voltage $V_S$ to the source 101 (such as ground potential), a drain voltage $V_D$ to the drain 102 (a sequence of pulses increasing incrementally or a constant voltage), a gate voltage $V_G$ to the control gate 103 (a constant voltage in the example shown set at a level which corresponds to a self-convergent threshold voltage corresponding with one of more than two data values for a multibit cell), and a substrate voltage $V_B$ to the substrate 100. The bias arrangement results in hot electron injection, caused by current flowing in the channel which supplies hot electrons to be injected through the gate dielectric 105 near the drain, and which converges on a threshold, as explained in more detail below.

Figure 2:
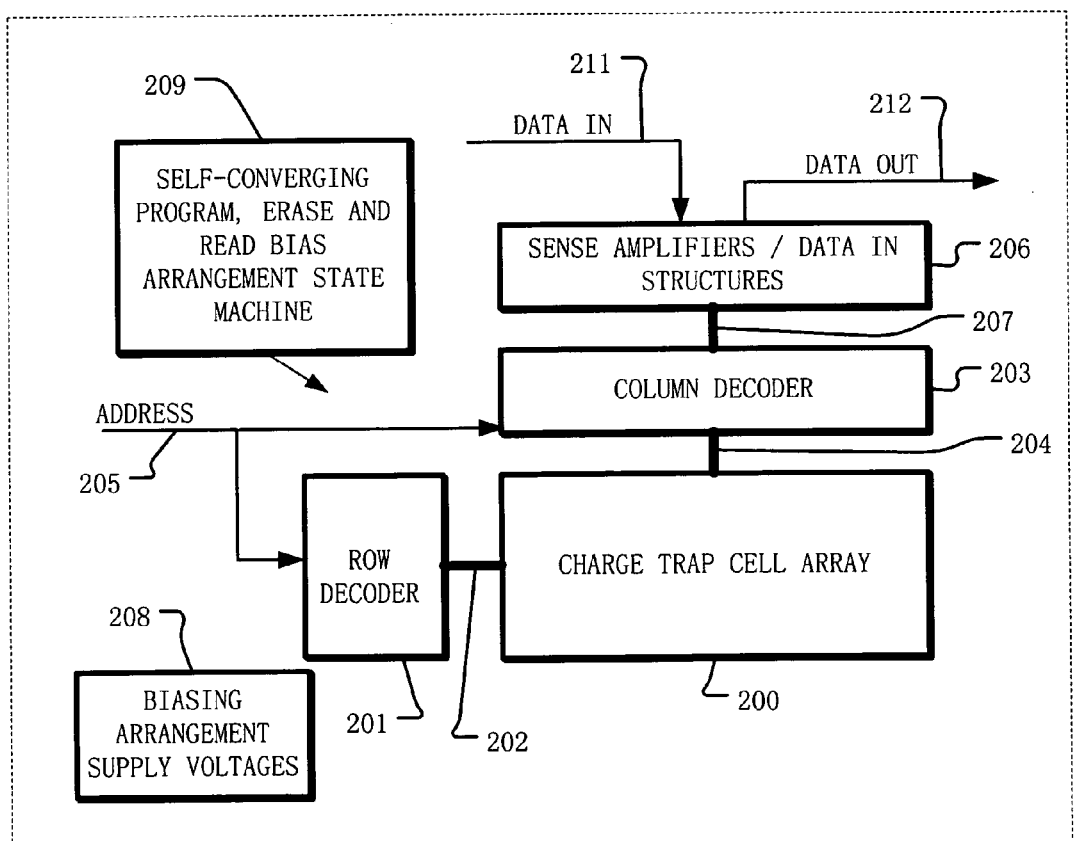
FIG. 2 is a simplified diagram of an integrated circuit memory device based on NROM memory cells with a self-convergence programming algorithm according to an embodiment of the present invention.

FIG. 2 is a simplified block diagram of an integrated circuit including a memory array 200 implemented using NROM memory cells with self-converging program operations implemented by a state machine. Other embodiments use memory cells with charge storage elements other than a silicon nitride charge trapping layer, as used in a typical NROM cell, such as conductive floating gates as used in typical flash memory cells, and charge trapping layers comprising materials other than nitride. A row decoder 201, responsive to addresses on bus 205, is coupled to a plurality of word lines 202 arranged along rows in the memory array 200. A column decoder 203, responsive to addresses on line 205, is coupled to a plurality of bit lines 204 arranged along columns in the memory array 200. Addresses are supplied on bus 205 to column decoder 203 and row decoder 201. Sense amplifiers are provided in block 206, and coupled to the column decoder 203 via data bus 207. Data is supplied via the data-in line 211 from input/output ports on the integrated circuit to the data-in structures (not shown). Data is supplied via the data-out line 212 from the sense amplifiers in block 206 to input/output ports on the integrated circuit.

In some embodiments, resources for controlling the reading, programming and erasing of memory cells in the array 200 are included on the chip. According to embodiments of the present invention, a self-converging program operation is implemented. These resources include read/erase/program supply voltage sources represented by block 208, and the state machine 209, which are coupled to the array 200, the decoders 201, 203 and other circuitry on the integrated circuit, which participate in operation of the device.

The supply voltage sources 208 are implemented in various embodiments using charge pumps, voltage regulators, voltage dividers and the like as known in the art, for supplying various voltage levels, including negative voltages, used in the read, erase and program operations.

The state machine 209 supports read, erase and program operations. The state machine 209 can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the state machine. The program operation of the present invention, which is self-converging in some embodiments, is described with reference to FIGS. 3–10.

Figure 3:
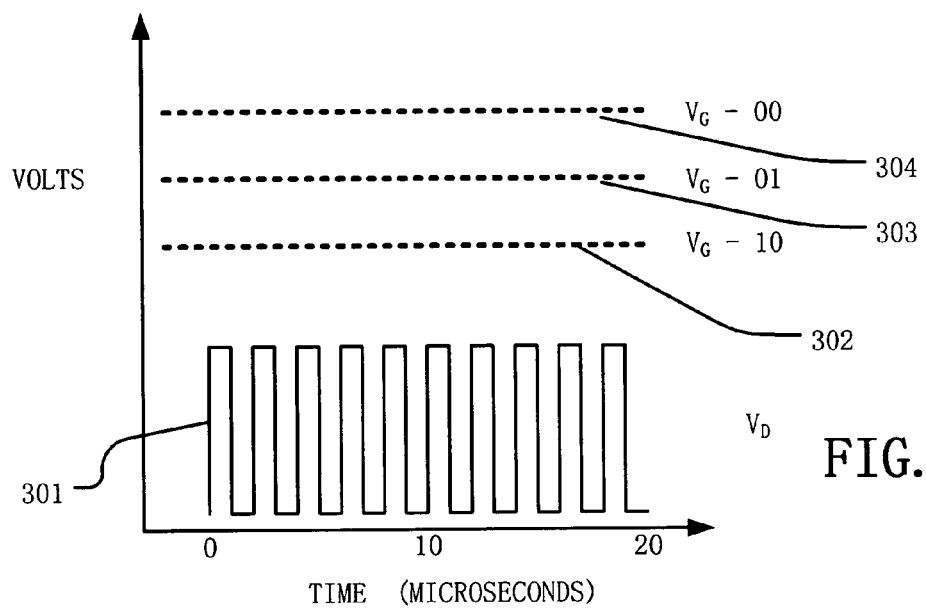
FIG. 3 illustrates voltages applied during a programming operation according to an embodiment of the present invention with two bits per cell.

FIG. 3 illustrates the applied gate and drain voltages for a programming operation for an NROM cell as shown in FIG. 1, according to one embodiment of the invention. The programming operation is designed to establish a target threshold voltage in the memory cell by injecting charge into the charge trapping layer 104. The programming operation includes applying a source voltage $V_S$ such as ground or another reference potential, to the source of a selected memory cell, a drain voltage $V_D$ to the drain of a selected memory cell as shown on trace 301, a gate voltage $V_G$ to the control gate of a selected memory cell which is selected from one of the predetermined gate voltages that correspond with a data value to be stored in the cell, as shown on traces 302–304, and a substrate bias $V_B$ such as ground or another reference voltage. As can be seen in FIG. 3, the programming operation includes applying a sequence of drain pulses having pulse heights, where the pulse heights are substantially constant at about 5 volts, for example, during the operation. The gate voltage $V_G$ is held substantially constant at a selected level, which correlates with the target threshold voltage. As illustrated, a gate voltage on trace 302 of about 8 volts corresponds with a data value of <10>, and a target threshold of about 2.5 volts. A gate voltage at the level of trace 303 of about 10 volts corresponds with a data value of <01>, and a target threshold of about 3.1 volts. A gate voltage on trace 304 of about 12 volts corresponds with a data value of <00>, and a target threshold of about 3.7 volts. The <11> data value is represented by the erased lowest threshold state, which is achieved using hot hole injection or other processes that add positive charge or remove negative charge from the charge trapping structure. In the particular example shown in FIG. 3, the drain voltage $V_D$ is applied in a sequence of about ten pulses about 1.0 microsecond long with constant pulse height of about 5 volts. Of course other pulse widths and pulse heights can be utilized as suits a particular embodiment.

The pulses may be applied with intervals of zero voltage between the pulses. In self-converging program algorithms according to the present invention, in which no verify step is executed, the number of pulses (or amount of program time) is predetermined at a count that can be empirically determined to establish the target threshold voltage reliably across the memory array. As demonstrated by the experimental results described below, self-convergence can be achieved in a relatively small amount of time, so that on the order of 10 microseconds of program time (about 10 pulses) may be needed in various embodiments of the invention.

Figure 4:
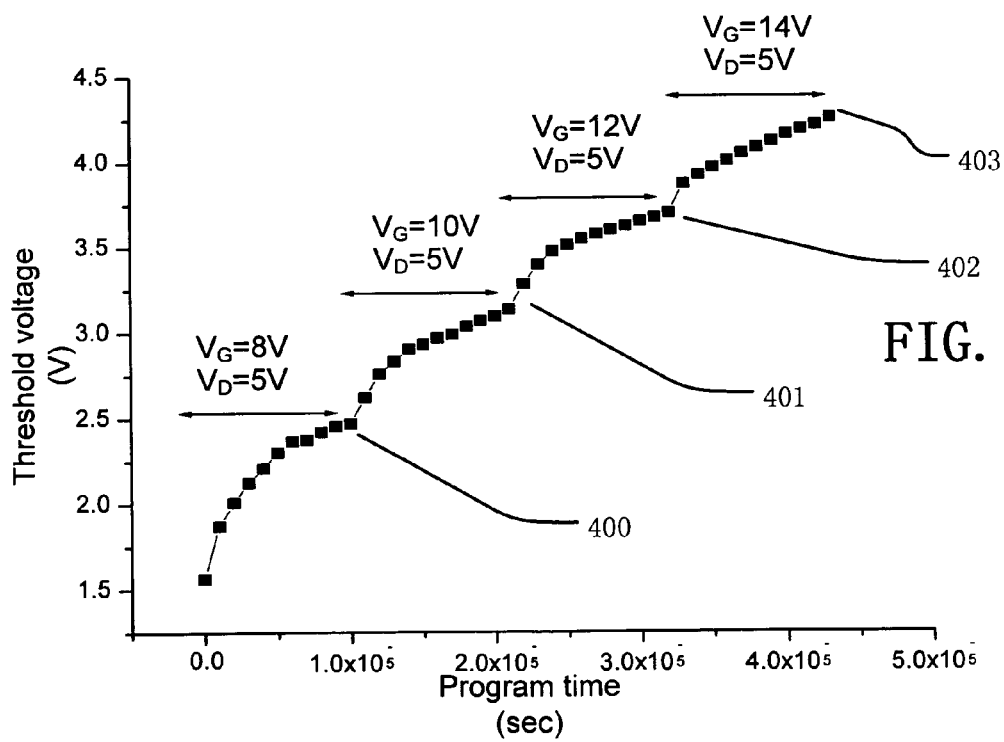
FIG. 4 is a graph of the threshold voltage versus programming time, showing results for the programming operation illustrated in FIG. 3.

FIG. 4 shows threshold voltage versus programming time for the program algorithm explained with reference to FIG. 3. The reverse read threshold for the $V_D$ constant, $V_G$ at level 302 near 8 volts algorithm is seen to converge on the target threshold shown at level 400. The reverse read threshold for the $V_D$ constant, $V_G$ at the level 303 near 10 volts algorithm is seen to converge on the target threshold shown at level 401. The reverse read threshold for the $V_D$ constant, $V_G$ at the level of trace 304 near 12 volts algorithm is seen to converge on the target threshold shown at level 402. The reverse read threshold for the $V_D$ constant, $V_G$ at level near 14 volts (not illustrated in FIG. 3) is seen to converge on the target threshold shown at level 403.

Figure 5:
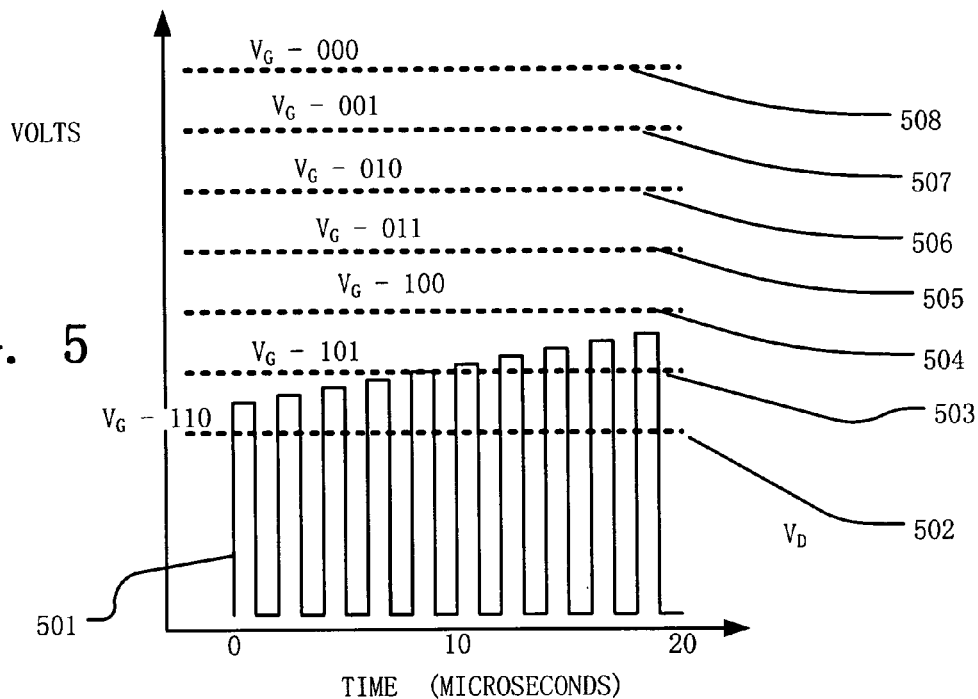
FIG. 5 illustrates voltages applied during a programming operation according to an embodiment of the present invention with three bits per cell.

FIG. 5 illustrates the applied gate and drain voltages for a programming operation for an NROM cell as shown in FIG. 1, according to an embodiment of the invention storing three bits per cell, and using a stepped drain voltage. The programming operation is designed to establish a target threshold voltage in the memory cell by injecting charge into the charge trapping layer 104. The programming operation includes applying a source voltage $V_S$ such as ground or another reference potential, to the source of a selected memory cell, a drain voltage $V_D$ to the drain of a selected memory cell as shown on trace 501, a gate voltage $V_G$ to the control gate of a selected memory cell which is selected from one of the predetermined gate voltages that correspond with a data value to be stored in the cell, as shown on traces 502–508, and a substrate bias $V_B$ such as ground or another reference voltage. As can be seen in FIG. 5, the programming operation includes applying a sequence of drain pulses having pulse heights, where the pulse heights increase from about 7 volts to about 9 volts, for example, during the operation. The gate voltage $V_G$ is held substantially constant at a selected level, which correlates with the target threshold voltage.

Figure 6:
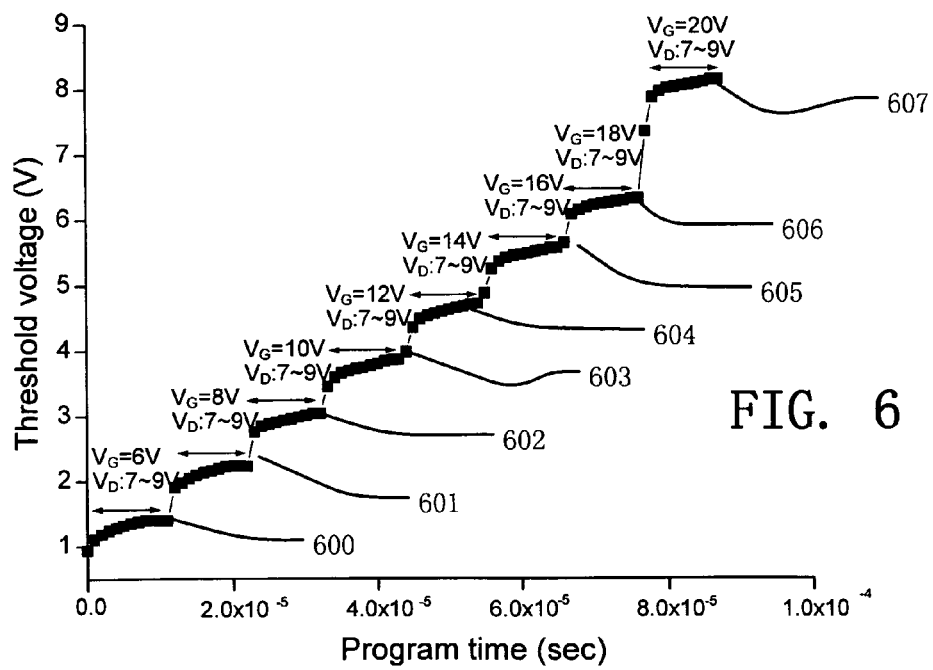
FIG. 6 is a graph of the threshold voltage versus programming time, showing results for the programming operation illustrated in FIG. 6.

FIG. 6 shows threshold voltage versus programming time for the program algorithm explained with reference to FIG. 5. As illustrated, a gate voltage on trace 502 of about 6 volts corresponds with a data value of <110>, and a target threshold level 600 of about 1.4 volts. A gate voltage on trace 503 of about 8 volts corresponds with a data value of <101>, and a target threshold level 601 of about 2.2 volts. A gate voltage on trace 504 of about 10 volts corresponds with a data value of <100>, and a target threshold level 602 of about 3.1 volts. A gate voltage on trace 505 of about 12 volts corresponds with a data value of <011>, and a target threshold level 603 of about 4.0 volts. A gate voltage on trace 506 of about 14 volts corresponds with a data value of <010>, and a target threshold level 604 of about 4.8 volts. A gate voltage on trace 507 of about 16 volts corresponds with a data value of <001>, and a target threshold level 605 of about 5.6 volts. A gate voltage on trace 508 of about 18 volts corresponds with a data value of <000>, and a target threshold level 606 of about 6.3 volts. The results of applying a gate voltage of about 20 volts is shown as well, converging on a target threshold level 607 of about 8.0 volts. The <111> data value is represented by the erased, lowest threshold state, providing 8 threshold levels corresponding to the 8 data values stored for 3 bits of data. In the particular example shown in FIG. 3, the drain voltage $V_D$ is applied in a sequence of about ten pulses about 1.0 microsecond long, with increasing amplitude of 0.2 volts per step, increasing from about 7 volts to about 9 volts. Of course other pulse widths and pulse heights can be utilized as suits a particular embodiment.

In the embodiments shown in FIGS. 3 and 5, there are no program verify operations between the program pulses. Rather, a predetermined number of pulses is applied, and because of the self-converging nature of the program operation, the algorithm is finished after that number of pulses is applied. A verify step can be applied at the end of the pulse sequence to ensure that the cell did not fail.

Figure 7:
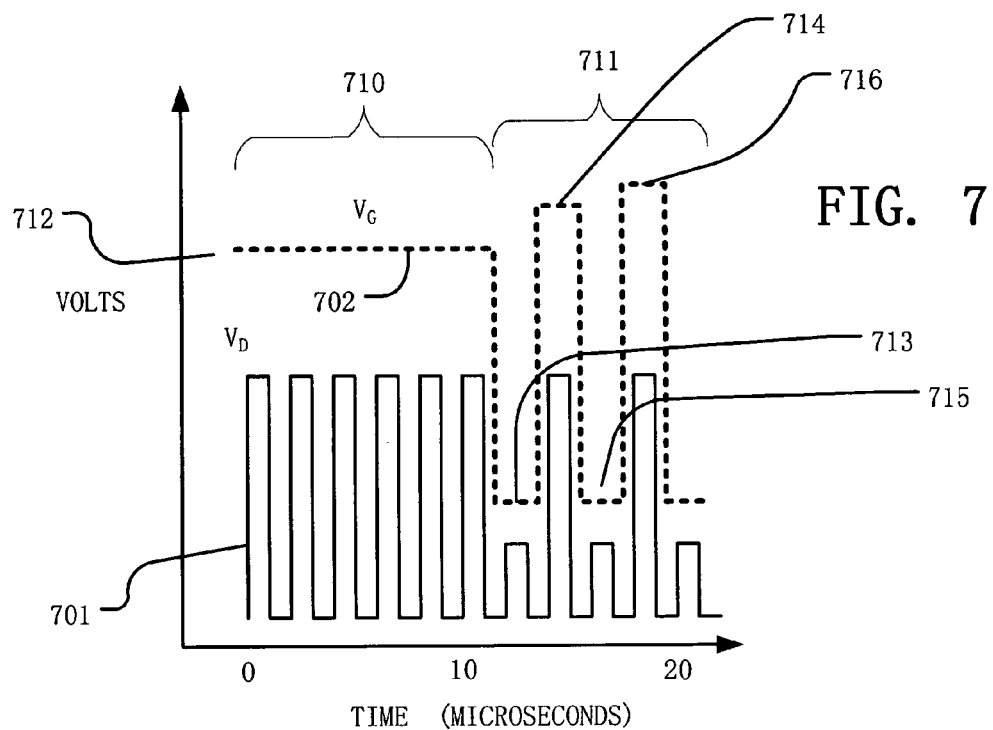
FIG. 7 illustrates voltages applied during a programming operation according to an embodiment of the present invention, including a first portion without verify operations and a second portion with verify operations.

In alternative algorithms, a second portion of the program operation can be applied after a self-converging set of pulses, as shown in FIGS. 3 and 5. The second portion includes verify steps to provide better control over cell variations. An example operation with a first portion without verify and a second portion with verify is shown in FIG. 7. The programming operation shown in FIG. 7 includes a first portion 710 executed first in time that includes applying a source voltage $V_S$ such as ground or another reference potential, to the source of a selected memory cell, a drain voltage $V_D$ to the drain of a selected memory cell as shown on trace 701, a gate voltage $V_G$ to the control gate of a selected memory cell which is selected from one of the predetermined gate voltages that correspond with a data value to be stored in the cell, as shown on trace 702, and a substrate bias $V_B$ such as ground or another reference voltage. As can be seen in FIG. 7, the first portion 710 of the programming operation includes applying a sequence of drain pulses having pulse heights, where the pulse heights are substantially constant at about 5 volts, for example, during the operation. The gate voltage $V_G$ is held substantially constant at a selected level, which correlates with the target threshold voltage at a first target level 712 slightly less than the target program verify threshold. In the second portion 711 of the program operation, the gate voltage is set to a second target level 713 corresponding with the target program verify level, supporting a verify operation, then a gate voltage pulse 714 is applied in parallel with the next drain voltage pulse. Then the gate voltage is set to the verify level 715, and a gate voltage pulse 716 is applied in parallel with the next drain voltage pulse. The process continues until a successful verify, or until a maximum number of retries.

Figure 8:
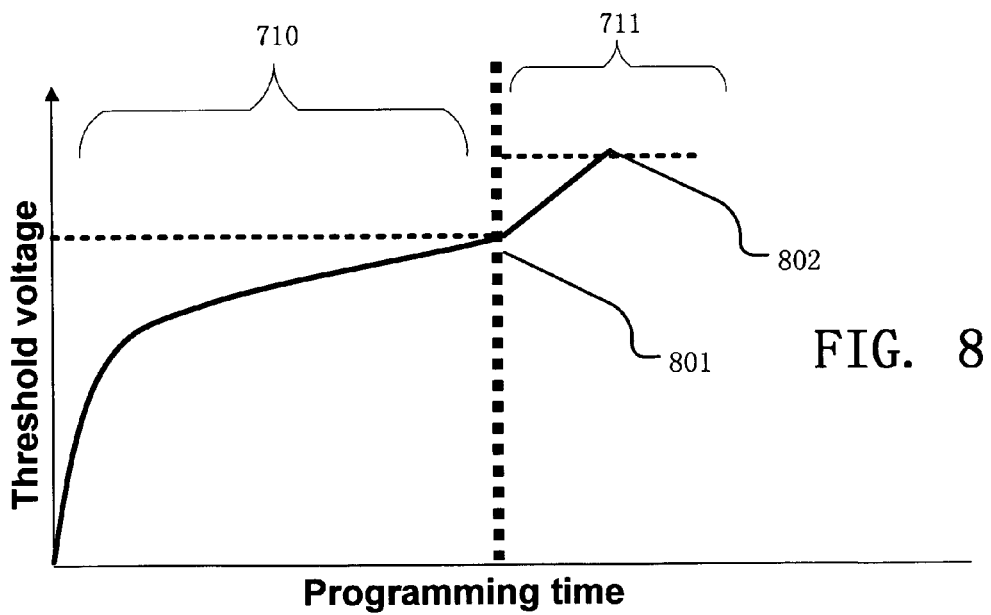
FIG. 8 is a graph of the threshold voltage versus programming time, showing results for the programming operation illustrated in FIG. 7.

FIG. 8 shows threshold voltage versus programming time for the two portions of the program algorithm explained with reference to FIG. 7. In the first portion 711, the read threshold converges on a first target level 801, that corresponds with the data value to be stored. In the second portion of the program operation, the read threshold increases to the final target threshold 802. The first portion proceeds rapidly, because there are no verify operations. The second portion converges rapidly because a small change in threshold is need, and includes verify operations that improve threshold margins across the array. The programming bias arrangement during the second portion need not be a self converging arrangement, but can be adapted for fast closure on the target threshold, including, but not limited to, constant gate voltage with constant drain voltage, constant gate voltage with stepped drain voltage, stepped gate voltage with constant drain voltage, and a combination of gate voltage stepping with drain voltage stepping.

Figure 9:
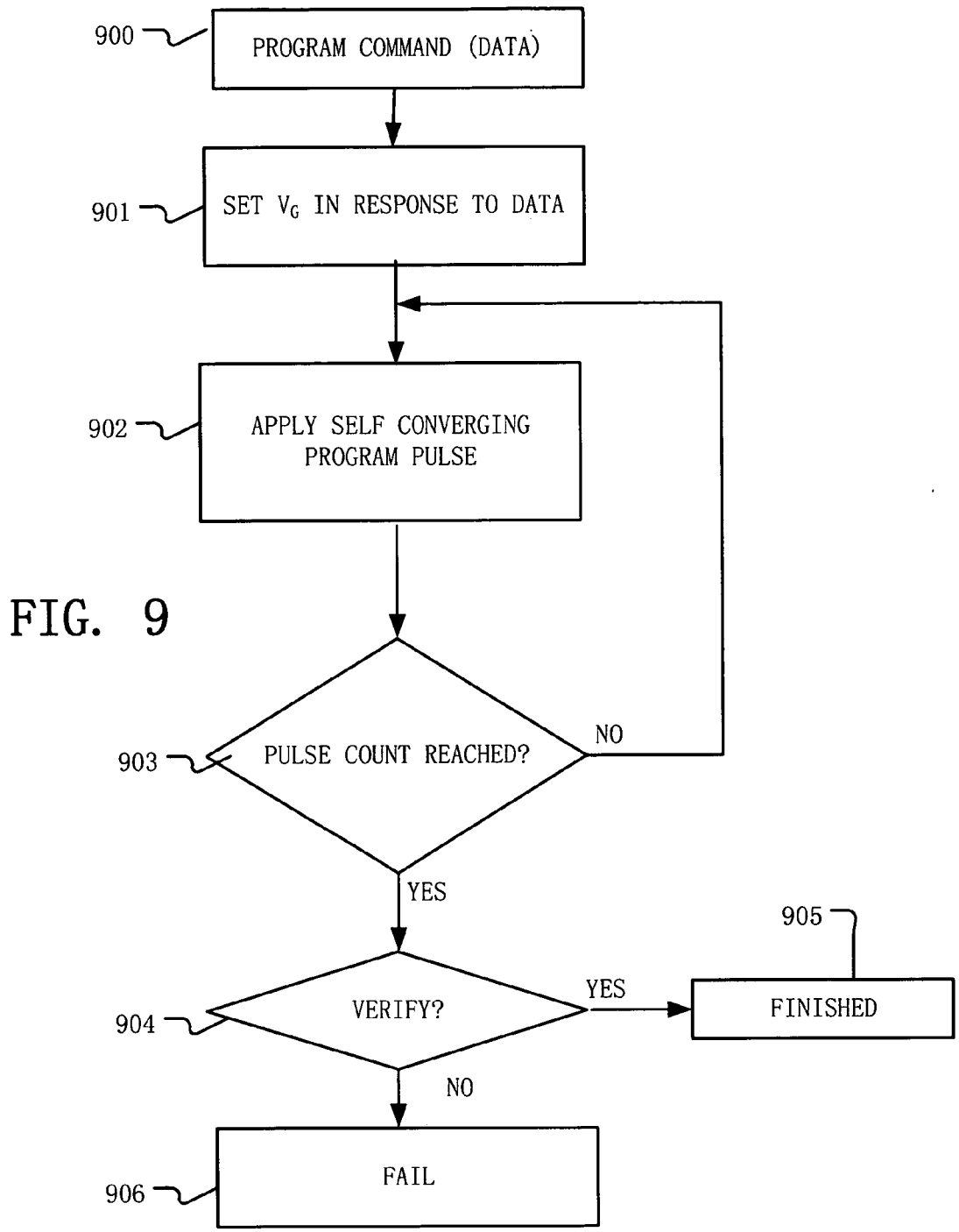
FIG. 9 is a simplified flowchart for a programming algorithm according to embodiments of the present invention.
Figure 10:
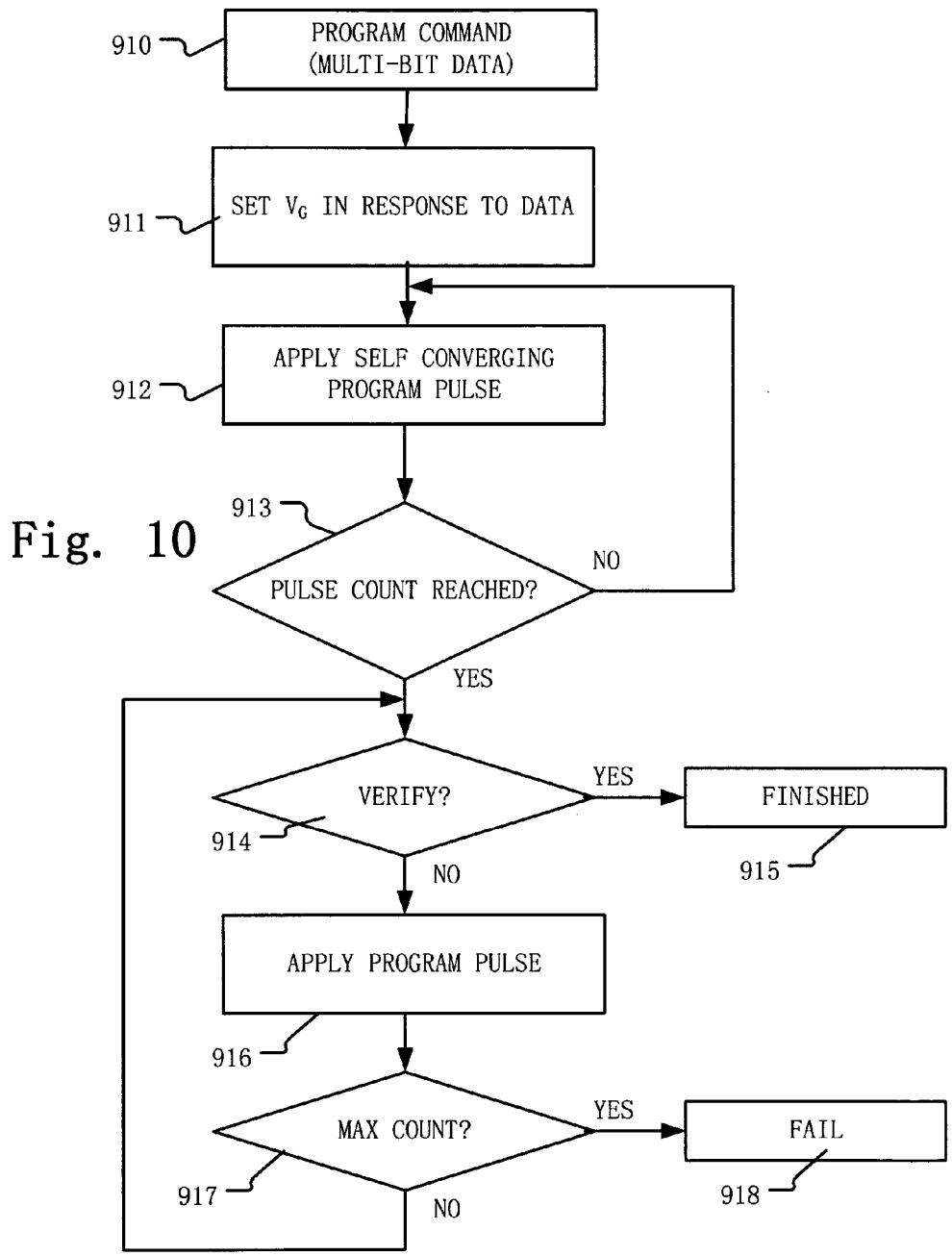
FIG. 10 is a simplified flowchart for a programming algorithm according to embodiments of the present invention, with programming and verify pulses after a first self-converging portion of the operation.

FIGS. 9 and 10 illustrate basic program operations implementing techniques described above. In FIG. 9, the process begins with a program command to store a particular data value in a selected memory cell (block 900). The gate voltage for the selected cell is set to a voltage level in response to the particular data value (block 901). Then, the self-converging program pulse sequence, as illustrated in FIG. 3 or FIG. 5, is executed, including applying a program pulse (block 902), determining whether the predetermined pulse count has been reached (block 903). If at block 903, the pulse count has not been reached, then the algorithm loops back to block 902 to apply a next pulse. If at block 903, the predetermined pulse count has been reached, then the sequence of programming pulses is completed. A verify operation is executed (block 904) in this example after the sequence of pulses for the program operation is complete. If the cell successfully verifies, then the program operation is completed (block 905). If at block 904, the verify operation fails, then the program operation fails (block 906). After a failed program operation, the sequence can be retried, or a true failure can be indicated, depending on the particular implementation.

FIG. 10 illustrates the program operation described above with reference to FIG. 7. In FIG. 10, the process begins with a program command to store a particular data value in a selected memory cell (block 910). The gate voltage for the selected cell is set to a voltage level in response to the particular data value (block 911). Then, the first portion of the self converging program pulse sequence, as illustrated in FIG. 7, is executed, including applying a program pulse (block 912), determining whether the predetermined pulse count has been reached (block 913). If at block 913, the pulse count has not been reached, then the algorithm loops back to block 912 to apply a next pulse. If at block 913, the predetermined pulse count has been reached, then the set of pulses, without verify, for the first portion of the program operation is completed. Next, in this example, a verify operation is executed (block 914). If the cell successfully verifies, then the program operation is completed (block 915). If at block 914, the verify did not succeed, then a program pulse for the second portion of the program operation is applied (block 916). Next, it is determined whether the maximum number of retry pulses has been applied at block 917. If not, then the algorithm loops back to block 914 to perform a verify operation. If at block 917, the maximum count has been reached, then a true failure is indicated (block 918).

As described herein, improved programming speed and reliability can be achieved by controlling the programming parameters including drain voltage, source voltage, pulse width and programming time under a fixed gate voltage to achieve a self-saturated read threshold VT. The gate voltage is selected according to the data value to be stored, to define the multiple saturated threshold states for multiple level cell applications. In some embodiments, a program-verify level is set that is higher than the saturated threshold state, so that no verify operation is required during the programming sequence. Also, using a self-saturated programming operation including two steps can be applied, including a first portion without verify, and a second portion with verify. According to the two-step operation, during a first portion of the program sequence without verify, the target threshold state is achieved which is less than the program verify level that corresponds with the target data value. During a second portion, program pulses are applied with a program verify step to reduce the threshold voltage to improve the distribution of thresholds in the array.

For NROM, NROM-type and floating gate flash memory, self-saturated read thresholds are predetermined, fixed gate voltages, while controlling the other programming parameters. The threshold level and of the voltage margin around a threshold level for multilevel operation can be controlled by adjusting the gate voltage. Program verify time can be eliminated or reduced in the programming operation to improve device performance. Also, the two-step programming method is provided, where the first step is executed without verify, and the second step is executed with verify, reducing the time required for program verify while allowing precision control of the threshold voltage distribution.

The present invention provides a high speed, self-converging algorithm for programming NROM and related non-volatile memory based on charge storage structures. The algorithm is applicable as well to floating gate flash memory cells.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for programming a charge storage memory cell having a first terminal and a second terminal acting as a source and a drain in a substrate, a charge storage element, and a control gate, comprising:

executing a program operation to induce charge transfer by hot electron injection to the charge storage element to establish a threshold voltage for the memory cell, the program operation including applying a sequence of drain voltage pulses having pulse heights to the second terminal of the memory cell during the program operation, the sequence of drain voltage pulses including a first set of pulses applied during said portion of the program operation, without verify operations between the pulses, and a second set of pulses applied during a second portion of the program operation, and including applying verify pulses between at least two successive pulses in the second set of pulses;

applying a gate voltage to the control gate relative to a reference voltage, a source voltage to the first terminal relative to the reference voltage, and a drain voltage to the second terminal relative to the reference voltage; and holding the gate voltage substantially constant at one of a predetermined set of gate voltages in response to the determined data value during a portion of the program operation in which the voltage threshold converges on a target threshold corresponding with the determined data value.

2. The method of claim 1, wherein the operation is self-converging during the first portion of the program operation.

3. The method of claim 1, wherein the applying includes applying a sequence of drain voltage pulses having pulse heights to the second terminal of the memory cell during said first portion of the program operation and increasing the pulse heights of the drain voltage pulses in at least two successive pulses in the sequence.

4. The method of claim 1, including coupling the substrate to the reference voltage during the operation.

5. The method of claim 1, wherein said charge storage element in the memory cell comprises a non-conductive charge trap.

6. The method of claim 1, wherein said charge storage element in the memory cell comprises a conductive floating gate.

7. The method of claim 1, wherein said memory cell comprises an NROM cell.

8. The method of claim 1, wherein said memory cell comprises a flash memory cell.

9. An integrated circuit, comprising:

a memory array including decoding circuitry to select memory cells for programming, the memory cells having first and second terminals in a substrate acting as sources and drains, a charge storage element, and a control gate, wherein the memory cell is adapted to store more than two data values;

a voltage supply circuit coupled to the memory array adapted to apply a gate voltage, a source voltage and a drain voltage to the control gate, first terminal and second terminal, respectively, of memory cells in the array; and a program controller coupled to the decoding circuitry and to the voltage supply circuit, the program controller adapted to induce charge transfer by hot electron injection to the charge storage element and establish a threshold voltage in the selected memory cell, the program operation including applying a sequence of drain voltage pulses having pulse heights to the second terminal of the memory cell during the program operation, the sequence of drain voltage pulses including a first set of pulses applied during said portion of the program operation, without verify operations between the pulses, and a second set of pulses applied during a second portion of the program operation, and including applying verify pulses between at least two successive pulses in the second set of pulses;

applying a gate voltage to the control gate relative to a reference voltage, a source voltage to the first terminal relative to the reference voltage, and a drain voltage to the second terminal relative to the reference voltage; and holding the gate voltage substantially constant at one of a predetermined set of gate voltages in response to the determined data value during a portion of the program operation in which the voltage threshold converges on a target threshold corresponding with the determined data value.

10. The integrated circuit of claim 9, wherein the applying includes applying a sequence of drain voltage pulses having pulse heights to the second terminal of the memory cell during said first portion of the program operation and increasing the pulse heights of the drain voltage pulses in at least two successive pulses in the sequence.

11. The integrated circuit of claim 9, including holding the gate voltage substantially constant during said first portion of the program operation.

12. The integrated circuit of claim 9, wherein the substrate is coupled to the reference voltage during the operation.

13. The integrated circuit of claim 9, wherein said charge storage element in the memory cell comprises a non-conductive charge trap.

14. The integrated circuit of claim 9, wherein said charge storage element in the memory cell comprises a conductive floating gate.

15. The integrated circuit of claim 9, wherein said memory cell comprises an NROM cell.

16. The integrated circuit of claim 9, wherein said memory cell comprises a flash memory cell.

* * * * *